US009240283B2

(12) United States Patent
Monaghan et al.

(10) Patent No.: US 9,240,283 B2
(45) Date of Patent: Jan. 19, 2016

(54) SINGLE CRYSTAL HIGH DIELECTRIC CONSTANT MATERIAL AND METHOD FOR MAKING SAME

(71) Applicant: University College Cork—National University of Ireland, Cork (IE)

(72) Inventors: Scott Monaghan, Cork (IE); Ian Povey, Cork (IE)

(73) Assignee: University College Cork—National University of Ireland, Cork (IE)

( * ) Notice: Subject to any disclaimer, the term of this patent is extended or adjusted under 35 U.S.C. 154(b) by 0 days.

(21) Appl. No.: 14/352,852

(22) PCT Filed: Oct. 22, 2012

(86) PCT No.: PCT/EP2012/070899
§ 371 (c)(1),
(2) Date: Apr. 18, 2014

(87) PCT Pub. No.: WO2013/057321
PCT Pub. Date: Apr. 25, 2013

(65) Prior Publication Data
US 2014/0332746 A1    Nov. 13, 2014

Related U.S. Application Data

(60) Provisional application No. 61/549,751, filed on Oct. 21, 2011.

(30) Foreign Application Priority Data

Oct. 21, 2011 (EP) .................................... 11186166

(51) Int. Cl.
*H01G 7/04* (2006.01)
*H01L 21/28* (2006.01)
(Continued)

(52) U.S. Cl.
CPC ............ *H01G 7/04* (2013.01); *H01L 21/28194* (2013.01); *H01L 28/40* (2013.01); *H01L 29/517* (2013.01); *H01L 45/12* (2013.01); *C30B 29/16* (2013.01)

(58) Field of Classification Search
CPC ............ H01L 45/04–45/085; H01L 21/02148; H01L 21/02159; H01G 7/00–7/06
See application file for complete search history.

(56) References Cited

U.S. PATENT DOCUMENTS 3,515,508 A * 6/1970 Hulliger .................. 423/326
7,112,485 B2 * 9/2006 Vaartstra ................. 438/240
(Continued)

OTHER PUBLICATIONS

Rignanese et al., "Dielectric properties of crystalline and amorphous transition metal oxides and silicates as potential high-κ candidates: the contribution of density-functional theory," J. Phys.: Condens. Matter, vol. 17, (2005), pp. R357-R379.*
(Continued)

*Primary Examiner* — Tucker J Wright
(74) *Attorney, Agent, or Firm* — Occhiuti & Rohlicek LLP

(57) ABSTRACT

The invention provides a stable oxide material system for a capacitor, electronic device or a memory device having an effective high-k value with an effective zero alpha while exhibiting low leakage current density. The stable oxide material comprises $M_x\text{-Si}_{1-x}O_2$, wherein the elements M & Si are mixed such that the insulator layer comprises staggered edge-linked $SiO_2\text{-}MO_2$ bonding chains to provide a stable 3-dimensional single crystal system.

21 Claims, 8 Drawing Sheets

(51) Int. Cl.
*H01L 29/51* (2006.01)
*H01L 49/02* (2006.01)
*H01L 45/00* (2006.01)
*C30B 29/16* (2006.01)

(56) References Cited

U.S. PATENT DOCUMENTS

| | | | | |
|---|---|---|---|---|
| 8,476,155 | B1* | 7/2013 | Lim et al. | 438/584 |
| 2002/0051334 | A1* | 5/2002 | Zhu et al. | 361/277 |
| 2008/0233764 | A1* | 9/2008 | Takahashi et al. | 438/785 |
| 2009/0057737 | A1* | 3/2009 | Boescke et al. | 257/295 |
| 2009/0302296 | A1* | 12/2009 | Fuchigami et al. | 257/2 |
| 2010/0006954 | A1* | 1/2010 | Huang et al. | 257/410 |
| 2010/0176432 | A1* | 7/2010 | Ramaswamy et al. | 257/316 |
| 2010/0244192 | A1* | 9/2010 | Nakagawa et al. | 257/532 |
| 2011/0227143 | A1* | 9/2011 | Lee et al. | 257/325 |
| 2012/0295398 | A1* | 11/2012 | Kurunczi et al. | 438/104 |
| 2013/0072030 | A1* | 3/2013 | Wang et al. | 438/785 |

OTHER PUBLICATIONS

Rignanese et al., "First-principles investigation of high-k dielectrics: Comparison between the silicates and oxides of hafnium and zirconium," Physical Review B 69, 184301, pp. 1-10, 2004.*

Ushakov et al., "Crystallization in hafnia- and zirconia-based systems," phys. stat. sol. (b), 241, No. 10, pp. 2268-2278 (2004).*

* cited by examiner

SINGLE CRYSTAL HIGH DIELECTRIC CONSTANT MATERIAL AND METHOD FOR MAKING SAME

CROSS REFERENCE TO RELATED APPLICATION

This application is the national phase under 35 USC 371 of international application no. PCT/EP2012/070899, filed Oct. 22, 2012, which claims the benefit of the priority date of European application no. 11186166.2, filed Oct. 21, 2011 and U.S. Provisional application no. 61/549,751, filed Oct. 21, 2011. The contents of the aforementioned applications are incorporated herein in their entirety.

FIELD OF THE INVENTION

The invention relates to a high dielectric material. In particular the invention relates to a low temperature deposited high-k dielectric material for Metal-Insulator-Metal (MIM) capacitor applications with an additional application in Metal-Insulator-Semiconductor (MIS or MOS) systems.

BACKGROUND TO THE INVENTION

A particular type of capacitor design is a Metal-Insulator-Metal (MIM) capacitor. MIM Capacitor devices are pervasively used in all modern day electronic devices, and in particular radio frequency and analogue circuitry. MOS capacitor structures are an integral part of MOS Field-Effect Transistors (MOSFETs) used extensively in digital circuitry. Portable consumer and communication devices are driving miniaturisation of these devices along with ultra lower power consumption requirements to extend battery life.

Miniaturisation of digital components has centred on the scaling of MOSFET devices, and this has been achieved so far with the introduction of metal gate/high-k/Si MOS structures. Nevertheless, future scaling will likely require the replacement of Si with a higher mobility semiconductor like Ge and/or $In_{0.53}Ga_{0.47}As$ in combination with alternative architecture (e.g. trigate MOSFET, junctionless MOSFET, etc.), introducing different problem issues in controlling device performance. One problem with high-k materials is the capacitance hysteresis observed for high-k material systems, causing variability in the electrical characteristics and thereby directly affecting device performance.

Miniaturisation of RF and analog components is a real problem in the electronics industry. Four key requirements of a dielectric in the design of a capacitor device are to: (i) aim for a low frequency capacitance density as high as possible at zero DC bias; (ii) have as low a leakage current density as possible at the device operating voltage to ensure reliable operation; (iii) have as high a breakdown voltage (BV) as possible for a given thickness (Electric Field Breakdown [MV/cm]), preferably at twice the operating voltage; and (iv) have negligible charge trapping (negligible Capacitance-Voltage hysteresis).

The behaviour of capacitance with applied DC bias is measured using $(C_{max}-C_{min})/C_{min}=C_{dif}=\alpha V^2+\beta V+c$, where $C_{min}$ is the minimum measured capacitance, $C_{max}$ is the capacitance at the maximum applied voltage, $\alpha$ is the quadratic voltage coefficient of capacitance, $\beta$ is the linear voltage coefficient of capacitance, and c is a constant accounting for any asymmetry in capacitance about 0V.

If $\alpha$ were approximately $\leq|50-100|$ ppm/$V^2$, the capacitor would exhibit approximate linear rather than quadratic behaviour with voltage, showing a slope determined by $\alpha$, since $\beta$ can be reduced to zero by circuit design methods, hence $\alpha$ is the determining factor whether capacitance varies with applied voltage. Units for measuring $\alpha$ are ppm/$V^2$ when $\beta=0$; but when $\beta\neq0$ then the units for measuring $\beta$ are ppm/V, since $C_{dif}$, $\alpha$, and $\beta$ are constants.

An additional requirement for many capacitor applications is that the capacitor exhibit linear capacitance behaviour with respect to the applied voltage, as a large non-linearity creates detrimental harmonics in electronic circuits, especially at high frequencies, as well as other non-ideal effects. A measure of this linearity is $\alpha$, since $\beta$ and c can be made to equal zero through careful circuit and device design.

For these same applications, capacitance should also remain linear as the temperature and frequency change: $\alpha(T_{max})-\alpha(T_{min})\leq|100|$ units/K, and $\alpha(F_{max})-\alpha(F_{min})\leq1\%$ units per decade, respectively. There are also many capacitor applications for which this linearity of capacitance with voltage, temperature, and frequency is not required. To date, for a given relative permittivity (k) and oxide thickness (t), higher capacitance has been achieved by using larger area capacitors, since $C=k\epsilon_0 A/t$, where C is capacitance, $\epsilon_0$ is a constant (the permittivity of free space), and A is the area of the capacitor. The requirement of large area for the capacitors prevents any significant reduction in the surface footprint size of analogue circuitry.

Reducing the oxide thickness (t) of the capacitor could in theory achieve the same capacitance (C) for a smaller capacitor area (A) for a given k, but this would detrimentally increase the leakage current and reduce the breakdown voltage of the capacitor.

The ideal solution for surface planar capacitors would be to increase the relative permittivity (k) of the oxide and reduce the area (A) for the same oxide thickness (t) to achieve the same or greater capacitance (C). However, to date this approach has been undermined by the high leakage and low breakdown voltages associated with high-k dielectrics, demonstrating high-k MIM devices but with unacceptable leakage and breakdown characteristics. Such structures also generally exhibit a high a value. Some high-k materials require annealing to achieve the highest k-value, and this can also contribute to higher leakage and lower breakdown voltages.

In addition, high-k materials are generally ionic systems and tend to have a significant density of charge trapping sites and therefore a significant hysteresis, which can be improved by selective deposition techniques, processing, and annealing but not entirely removed. Charge trapping, and the associated electrical variability, remain serious problems for high-k dielectrics.

Present MIM capacitors with control of a and hysteresis rely on low k-value and covalently bonded systems such as silicon oxide, silicon nitride, or silicon oxynitride dielectrics (k~4-6), as these oxides also allow control of the leakage and breakdown characteristics. A maximum capacitance is achieved through the use of large area capacitors. Minimal hysteresis is achieved through careful concentration ratio selections, processing and annealing.

Increased capacitance with reduced surface area can be achieve through stacking capacitors on top of each other in a 2-dimensional way and connecting in parallel. If the number of dielectric layers is n, then $C=n\times k\epsilon_0 A/t$, and the same capacitance can be achieved with reduced area. In reality there is a limit to the number of layers achievable due to processing constraints on conformal growth and connectivity requirements, and typical values of n are $\leq4$. MIM capacitors with high-k materials can also be made in this way permitting further scaling.

Another way to increase capacitance is by making 3-dimensional MIM capacitors inside trenches etched into silicon and surface treated to obtain an $SiO_2$ isolation layer. Conformal growth methods could then be used to grow single or stacked layers of metal-insulator-metal structures. This method permits the possibility of the area being increased to as large as possible alongside n and k in $C = n \times k\epsilon_0 A/t$. For this scenario it is the capacitor footprint on the surface that is minimised, not the device area. In reality, most deposition methods in industry have serious constrictive difficulties in making these type of capacitors. MIM capacitors with high-k materials can also be made in this way using conformal growth methods, permitting further scaling.

US patent publication number US 2006 0281264 A1, assigned to Matsushita Electric Industrial Co. Ltd., describes a gate insulator on a semiconductor substrate having a plurality of oxide layers perpendicular to the semiconductor surface and associated with respective phases.

The US patent publication discloses three stable layers formed from the ALD|CVD of $SiO_2$, $MSiO_4$, and $MO_2$ stable phases (M=Hf|Zr). However, problems with this approach are: (i) that an unstable interface is formed between the $SiO_2$ layer and the claimed $MSiO_4$ layer; (ii) the thickness of the amorphous $SiO_2$ layer increasing with time taking $SiO_2$ from the claimed $MSiO_4$ layer; and (iii) the claimed $MSiO_4$ layer actually moves increasingly towards a crystalline $MO_2$ concentration with time. Namely, the claimed $MSiO_4$ layer will reduce in $SiO_2$ concentration with time, and exhibit spontaneous phase separation to form amorphous $SiO_2$ and crystalline $MO_2$ ($M_xSi_{1-x}O_2$, $x=0.5 \rightarrow x=1.0$) with time.

The deposition of a higher x concentration $M_xSi_{1-x}O_2$ (M=Hf|Zr, x>0.5) will ensure a nucleation and growth phase separating structure due to two factors: (i) the deposited oxide (from bulk theory) will be intrinsically metastable at such x concentrations (not stable), and (ii) the oxide is deposited on $SiO_2$ ensuring the growth of $SiO_2$ from Si and O supplied by the decomposition of the $M_xSi_{1-x}O_2$ oxide.

Hence, phase separation is driven by the unstable bottom interface with amorphous $SiO_2$, the bulk phase separation and forming of amorphous $SiO_2$ and crystalline $MO_2$ clusters, and the changing x concentration to form amorphous $SiO_2$ and crystalline $MO_2$ ($M_xSi_{1-x}O_2$, $x>0.5 \rightarrow x=1.0$) with time.

It is clear that a MIM or MOS capacitor exhibiting such a structure of three stable phases claimed of $SiO_2$, $MSiO_4$, and $MO_2$ is neither stable with time nor free from crystalline grain boundaries that would cause high operating voltage leakage current densities and a low breakdown field.

To date the research and development community have only been able to synthesis amorphous or polycrystalline $M_xSi_{1-x}O_2$ metal silicates (0<x<1; M=Zr and/or Hf), which can be synthesised fairly easily. If synthesised films form amorphous systems, including the amorphous forms of zircon and hafnon, and they are exposed to a high enough temperature anneal in an appropriate ambient, they can be made polycrystalline.

However, the amorphous to crystalline transition does not form a single crystal for any significantly large crystallite length scale, but instead forms many small crystals all oriented in different directions with crystallite sizes very much smaller than the thickness of the films. The boundaries between these crystallite regions, called grain boundaries, render these dielectric films effectively useless for electronics applications due to the very high leakage and low breakdown voltages associated with such grain boundary rich films.

A paper publication by Ting-Ting Jiang et al., *J. Phys. D: Appl. Phys.* 44, 185402, 1-5 (2011) a theoretical simulation which tries to compare the electronic band gaps modelled and experimental amorphous high-k materials that could be used in a semiconductor device. However Ting-Ting Jiang does not demonstrate any type of device characteristics. The device properties referred to in the introduction section of the Ting-Ting Jiang et al. paper, with respect to the $ZrSiO_4$ and $HfSiO_4$ systems, are for amorphous systems only. Moreover modelling programs are not able to model amorphous systems because of their size and complexity. Geological studies of crystallites in naturally formed rock give lattice parameters for modelling crystalline systems, and these geological studies are the experimental results referred to in the paper for the unit cells used in the simulations. To date no one has been able to reproduce these materials for use in electronic devices and the prior art relates to purely amorphous or polycrystalline materials that are limited for electronic devices.

Another publication by T. S. Böscke et al., *Appl. Phys. Lett.* 91, 072902 (2007) reports on $HfO_2$ and the addition of 10% $SiO_2$ to form an amorphous $Hf_{0.9}Si_{0.1}O_2$ metal silicate (x=0.9, M=Hf). The T. S. Böscke et al. paper claims that crystallisation of amorphous $HfO_2$ into the monoclinic form of $HfO_2$ after a thermal anneal leads to increased leakage and the formation of local defects. By adding 10% $SiO_2$ to the amorphous $HfO_2$, T. S. Böscke et al claim that tetragonal $HfO_2$ is formed instead of monoclinic $HfO_2$ during the thermal anneal process. Doping amorphous $HfO_2$ with 10% $SiO_2$ and crystallising with a temperature anneal does not constitute the formation of amorphous, or polycrystalline $HfSiO_4$ (x=0.5) but the formation of $Hf_{0.9}Si_{0.1}O_2$ (x=0.9).

A further paper by K. Kukli et al., *Material Science and Engineering B* 109 (1-3), 2-5 (2004) reports experimental findings for two types of substrate layers on which they deposit their oxide:
I. $Si/SiO_2$ (1.2-1.8 nm)
II. Si (chemically etched, nominally Si—H)

The paper refers to Hf—Si—O which has a 2:1 Hf:Si concentration ratio (x~0.67) and is amorphous, and as such due to x and the amorphous properties of the material suffers from the same drawbacks as described above.

A further publication by Lizhi Ouyang and W. Y. Ching, *J. Appl. Phys.* 95 (12), 7918-7924 (2004) discloses a modelling paper similar to the Ting-Ting Jiang paper and simulates $(ZrO_2)x(SiO_2)1-x$ with x<0.5. Again the simulations use the lattice parameters from geological studies of crystallites in rock and then substitute Zr with Si cations to get x<0.5. The experimental comparison they refer to for $ZrSiO_4$ or zircon is from experiment XPS studies on powders with x=0.5 but in an amorphous or polycrystalline state.

An object of the invention is to provide a stable oxide material system for a capacitor or electronic device having an effective high-k value with an effective zero alpha while exhibiting low leakage current density and a high electrical breakdown field.

SUMMARY OF THE INVENTION

According to the invention there is provided, as set out in the appended claims, capacitor device comprising:
a first layer of material;
a second layer of material;
an insulator layer of material sandwiched between the first and second layers of the metal type materials, said insulator layer comprise $M_xSi_{1-x}O_2$, wherein the elements M and Si are mixed such that the insulator layer comprises staggered edge-linked $SiO_2$-$MO_2$ bonding chains to provide a stable 3-dimensional single crystal system.

The invention combines the achievement of a high capacitance (through achieving a high k-value) and negligible hysteresis, even without post-deposition annealing, while also exhibiting excellent leakage and breakdown characteristics. The invention improves the performance of current and future metal gate/high-k/semiconductor MOS-based devices. Achieving the correct bonding conditions is necessary at the as-deposited stage in order to achieve both the global three-dimensional single crystal stability and the associated excellent electrical properties, as described in more detail below. Man-made $ZrSiO_4$ or $HfSiO_4$ systems to date have either been purely amorphous or polycrystalline, and not a single crystal structure over the thickness ranges needed for electronic devices. Despite prior art simulations, no such bulk stable 3-dimensional single crystal system for $ZrSiO_4$ or $HfSiO_4$ over length scales applicable to electronic devices has ever been created. The invention represents the first ever synthesis of single crystal zircon and hafnon at length scales comparable to the thickness of the dielectric films required in electronic devices. This holds whether the system is doped or undoped ($N_y$, in $M_xN_ySi_{1-x}O_2$, with $0 \le y \le 0.05$).

The high-k material of the present invention achieves a higher dielectric constant than amorphous $MSiO_4$ (k~12) because a single crystal tetragonal structure is achieved, whether doped or un-doped. This high-k single crystal material does not exhibit the associated problems of low breakdown and high leakage associated with equivalent polycrystalline systems primarily because of the absence of grain boundaries and therefore offers the sought-after solution. Until now no solution has been found to the apparent inverse relation between k-value and operational leakage or breakdown field, and therefore the material can address the needs of radio frequency micro-electromechanical systems, analogue and mixed signals products. An additional contribution to the high breakdown field and low leakage is the semi-covalent bonding nature of the structure, which introduces strong electron-electron bonding rather than only weak ionic bonding, and this provides quantum-mechanical exclusion regions within the material system where charge cannot go without providing enough energy to displace electrons. Such displacement requires larger voltages to be applied across the dielectric, thereby contributing to the reduced leakage and increased electrical breakdown field.

The high temperature stability of the material, alongside the high-k and other properties, for the first time offers a high-k solution that can be fabricated at any stage in the device fabrication process, which means there would be flexibility of processing, design and enhanced integration. High temperature, high power devices to date use lower-k materials due to the requirement of high temperature stability of the oxide, so this breakthrough will have scaling implications for this type of application. The present invention out-performs existing technologies, such as high temperature stability enabling analogue and digital integration, reduced power consumption, negligible charge trapping due to the high quality bulk structure; and scalability of the dielectric from hundreds of nanometres to ~2 nanometres.

The unique bonding structure along [001], comprising staggered $SiO_2$-$MO_2$ ($SiO_4$-$MO_8$, tetrahedra-dodecahedra) chains in the absence of grain boundaries, whether doped or un-doped, is an important part of the key to achieving a combination of a high capacitor quality factor (Q), low leakage, a high electric field breakdown, and an effective zero alpha for the bulk material system when undoped. The tetragonal symmetry allows for obtaining the highest k-value possible, and therefore the highest capacitance density possible, in addition to the high stability with voltage, frequency, and CMOS temperatures. This tetragonal symmetry, which includes distributed and non-interacting $SiO_4$ tetrahedra, is part of the key to achieving a radiation hard material.

The invention solves the problem of obtaining a reliable, scalable, and stable high-k capacitor having all of the following as-deposited attributes: low deposition temperature; bulk linearity of capacitance behaviour with voltage ($\alpha \le |50-100|$ ppm/$V^2$ or in ppm/V), temperature (units/K), and frequency (1% units per decade); or with a controlled non-linearity if selectively doped; high relative permittivity; low leakage current density at the operating voltage (also with single dominant mechanisms at 0V—low±V and low ±V to ±breakdown voltage); high breakdown electric field (with no soft breakdown/stress events prior to hard breakdown) at 2× the operating voltage; negligible charge trapping and negligible hysteresis (if un-doped); a low (high) capacitor dissipation (quality) factor; radiation hard; thickness scalability for low to high voltage applications; bulk stability and reliability up to high processing temperatures ($\le 1050°$ C.); can lead to devices with increased speed; and reduced power consumption.

In one embodiment there is provided a capacitor device comprising
  a first layer of metal type material;
  a second layer of metal type material;
  an insulator layer of material sandwiched between the first and second layers of the metal type materials, said insulator layer comprises single crystal tetragonal $M_xN_ySi_{1-x}O_2$ ($\sim 0.45 \le x \le \sim 0.55$; $0 \le y \le \sim 0.05$) wherein the elements M and Si (M=Zr|Hf or M=Hf and Zr—the material system may also contain small doping concentrations of elements N that do not alter the structure significantly or beyond locally but may replace M and/or Si in some sites or may exist as oxidised interstitials. N could be Y, Sc, Ti, Nb, Lu, Ta, C, Ge, N, Ga, or In. $M_xN_ySi_{1-x}O_2$ is completely mixed as-deposited such that the insulator layer comprises throughout only staggered edge-linked $SiO_2$-$MO_2$ bonding chains along [001], or equivalently, only staggered edge-linked $SiO_4$ tetrahedra (T) and $MO_8$ dodecahedra (D) along [001], i.e. only T-D allowed along [001]. There are also no T-T linkages (or $SiO_2$—$SiO_2$ bonding chains) allowed in any direction; and also no D-D linkages (or $MO_2$-$MO_2$ bonding chains) allowed along [001]. Subject to these three properties, remaining D-D linkages are then permitted along [010] and [100], which are second order only. Additionally, N-doping will not significantly alter this structure beyond only local effects.

In one embodiment the first layer of metal type (e.g. Al, Au, TiN, doped polysilicon, etc.) material exhibits the conducting properties of a metal.

In one embodiment the second layer of metal type (e.g. Al, Au, TiN, doped polysilicon, etc.) material exhibits the conducting properties of a metal.

In one embodiment the single crystal tetragonal $M_xN_ySi_{1-x}O_2$ ($\sim 0.45 \le x \le \sim 0.55$; $0 \le y \le \sim 0.05$) wherein the elements M and Si are M=Zr|Hf or M=Hf and Zr—the material system may also contain small doping concentrations of elements N that do not alter the structure significantly or beyond locally but may replace M and/or Si in some sites or may exist as oxidised interstitials. N could be Y, Sc, Ti, Nb, Lu, Ta, C, Ge, N, Ga, or In. $M_xN_ySi_{1-x}O_2$ is completely mixed as-deposited. An important aspect of the invention is the translation of the dielectric local atomic structure to the expectant and resultant local and global electrical properties.

In one embodiment the insulator layer comprises a stable 3D crystalline symmetric mix of single crystal tetragonal $M_xN_ySi_{1-x}O_2$ ($\sim 0.45 \le x \le \sim 0.55$; $0 \le y \le \sim 0.05$) wherein the elements M and Si are M=Zr|Hf or M=Hf and Zr—the material system may also contain small doping concentrations of elements N that do not alter the structure significantly or beyond locally but may replace M and/or Si in some sites or may exist as oxidised interstitials. N could be Y, Sc, Ti, Nb, Lu, Ta, C, Ge, N, Ga, or In. $M_xN_ySi_{1-x}O_2$ is completely mixed as-deposited.

In one embodiment the bonding chains between M and Si oxide elements are symmetrically linked with each other in a three dimensional way such that no two same elements of M or Si are directly linked together along [001]; no two Si oxides are directly linked in any direction; and only staggered edge-linked $MO_2$ and $SiO_2$ chains are allowed along [001]. Subject to these conditions, $MO_2$ linkages are permitted along [100] and [010] as second order bonding only.

In one embodiment the $MO_8$ dodecahedra and $SiO_4$ tetrahedra are symmetrically linked with each other in a three dimensional way such that no two $SiO_4$ tetrahedra are directly linked together in any direction. Similarly, no two $MO_8$ dodecahedra are directly linked together along [001]. Only $SiO_4$ tetrahedra and $MO_8$ dodecahedra are linked together along [001]. Subject to these conditions, $MO_8$ dodecahedra can be linked together along [100] and [010] as second order bonding only.

In one embodiment the as-deposited insulator layer comprises a single crystal tetragonal configuration to ensure symmetrical linkages.

In one embodiment the first layer of material comprises $Al_2O_3$.

In one embodiment the second layer of material comprises $Al_2O_3$.

In one embodiment the bulk-stable 3D tetragonal crystalline structural properties of $MSiO_4$ can be maintained when sandwiched between two layers of $Al_2O_3$ or two layers of metal.

In one embodiment the bonding chains between M and Si oxide elements are symmetrically linked with each other in a three dimensional way such that no two same elements of M or Si are directly linked together along [001]; no two Si oxides are directly linked in any direction; and only staggered edge-linked $MO_2$ and $SiO_2$ chains are allowed along [001]. Subject to these conditions, $MO_2$ linkages are permitted along [100] and [010] as second order bonding only.

In one embodiment the $MO_8$ dodecahedra and $SiO_4$ tetrahedra are symmetrically linked with each other in a three dimensional way such that no two $SiO_4$ tetrahedra are directly linked together in any direction. Similarly, no two $MO_8$ dodecahedra are directly linked together along [001]. Only $SiO_4$ tetrahedra and $MO_8$ dodecahedra are linked together along [001]. Subject to these conditions, $MO_8$ dodecahedra can be linked together along [100] and [010] as second order bonding only.

It will be appreciated that very slight local variations in the crystalline structure can be accommodated provided they do not interact with other local regions exhibiting slight variations or change the global crystalline planes—otherwise sites for global instability in the crystal will form and grow, and grain boundaries will form through the change in crystalline planes.

Given that the insulator is deposited in a tetragonal crystalline form, it will be appreciated that epitaxial growth of the insulator material may be achieved on appropriately lattice-matched crystalline substrates, either directly or by use of an intermediate lattice-buffer. This would open up the possibility of epitaxial growth of the invention on semiconductor substrates such as GaN, Si, Ge, $Si_xGe_y$, GaAs, $In_xGa_{1-x}As$, etc.

Appropriate applications of the invention are Metal-Oxide-Semiconductor (MOS) devices, metal-in-silicon-oxide (MISO) devices, and Metal-Insulator-Metal (MIM) devices, employing these type of sub-components at the core of their device operation, provided that interface reactions are prevented by careful consideration of the material systems in contact. When there is a possibility of interface reactions, a very thin layer (~0.5 nm thickness ≤~1 nm) of $Al_2O_3$ can be deposited to prevent interface reactions taking place.

Potential material systems and electronic applications are numerous where there is a need for a reliable, scalable, and stable high-k dielectric material that has a full set or subset of the following properties when compared to lower-k, wide band gap, dielectric materials (k≤9, e.g. $SiO_2$, $SiO_xN_y$, $Si_xN_y$, $Al_xN_y$, $Al_2O_3$, etc.): high capacitance density for the equivalent thickness and area; low operating voltage leakage within a reasonable range (single dominant mechanisms at 0V—low ±V, low ±V to ±breakdown voltage); high breakdown field within a reasonable range at 2× the operating voltage (with no soft breakdown/stress events prior to hard breakdown); a quadratic voltage coefficient of capacitance that is effectively zero ($\alpha \le |50\text{-}100|$) for the un-doped bulk material, and not changing beyond this range with temperature or frequency; low processing temperature; negligible charge trapping and hysteresis; low capacitance dissipation; radiation hard; thickness scalability for low to high voltage applications; stability and reliability up to high processing temperatures (≤1050° C.); leads to increased speed of devices; and reduced power consumption.

The following are among the many applications, but not limited, that can incorporate the invention such as analogue-digital-converters (ADCs); digital-analogue-converters (DACs); micro-electro-mechanical-systems (MEMS)/radio frequency (RF) switches; analogue mixed signal units; amplifiers; comparators; decouplers; MOS-based devices (MOS-CAPs; MOSFETs: multi-gate devices, junctionless transistors, nanowires, etc.); epitaxial high-k oxide applications on metals, other oxides, or semiconductors; automotive applications; reduced power requirement applications such as portable devices; medical devices; applications requiring the integration of analogue and digital components; applications that would benefit from reduced space requirements, reduced material consumption, reduced energy/power consumption, and reduced costs.

In one embodiment there is provided a Resistive Random Access Memory (RRAM) device comprising an insulator material said insulator material comprises $M_xN_ySi_{1-x}O_2$ (~0.45≤x≤~0.55; 0≤y≤~0.05) wherein the elements M and Si are M=Zr|Hf or M=Hf and Zr—the material system may also contain small doping concentrations of elements N that do not alter the structure significantly or beyond locally but may replace M and/or Si in some sites or may exist as oxidised interstitials. N could be Y, Sc, Ti, Nb, Lu, Ta, C, Ge, N, Ga, or In. $M_xN_ySi_{1-x}O_2$ is completely mixed as-deposited), wherein the bonding chains between M and Si oxide elements are symmetrically linked with each other in a three dimensional way such that no two same elements of M or Si are directly linked together along [001]; no two Si oxides are directly linked in any direction; and only staggered edge-linked $MO_2$ and $SiO_2$ chains are allowed along [001].

Subject to these conditions, $MO_2$ linkages are permitted along [100] and [010] as second order bonding only. The $MO_8$ dodecahedra and $SiO_4$ tetrahedra are symmetrically linked with each other in a three dimensional way such that no two $SiO_4$ tetrahedra are directly linked together in any direction. Similarly, no two $MO_8$ dodecahedra are directly linked together along [001]. Only $SiO_4$ tetrahedra and $MO_8$ dodecahedra are linked together along [001]. Subject to these conditions, $MO_8$ dodecahedra can be linked together along [100] and [010] as second order bonding only Within this structure Ti or other elements are integrated into the matrix as N of y concentration in order to achieve the required RRAM properties.

In another embodiment there is provided a tunable capacitor device comprising an insulator material, said insulator material comprises $M_xN_ySi_{1-x}O_2$ (~0.45≤x≤~0.55; 0≤y≤~0.05) wherein the elements M and Si are M=Zr|Hf or M=Hf and Zr—the material system may also contain small doping concentrations of elements N that do not alter the structure significantly or beyond locally but may replace M and/or Si in some sites or may exist as oxidised interstitials. N could be Y, Sc, Ti, Nb, Lu, Ta, C, Ge, N, Ga, or In. $M_xN_ySi_{1-x}O_2$ is completely mixed as-deposited), wherein the bonding chains between M and Si oxide elements are symmetrically linked with each other in a three dimensional way such that no two same elements of M or Si are directly linked together along [001]; no two Si oxides are directly linked in any direction; and only staggered edge-linked $MO_2$ and $SiO_2$ chains are allowed along [001].

Subject to these conditions, $MO_2$ linkages are permitted along [100] and [010] as second order bonding only. The $MO_8$ dodecahedra and $SiO_4$ tetrahedra are symmetrically linked with each other in a three dimensional way such that no two $SiO_4$ tetrahedra are directly linked together in any direction. Similarly, no two $MO_8$ dodecahedra are directly linked together along [001]. Only $SiO_4$ tetrahedra and $MO_8$ dodecahedra are linked together along [001]. Subject to these conditions, $MO_8$ dodecahedra can be linked together along [100] and [010]. Within this structure Ti or other elements are integrated into the matrix as N of y concentration in order to achieve the required variation in alpha.

In a further embodiment of the present invention there is provided an insulator material suitable for use in a capacitor or an electronic device, said material comprises $M_xN_ySi_{1-x}O_2$ (~0.45≤x≤~0.55; 0≤y≤~0.05) wherein the elements M and Si are M=Zr|Hf or M=Hf and Zr—the material system may also contain small doping concentrations of elements N that do not alter the structure significantly or beyond locally but may replace M and/or Si in some sites or may exist as oxidised interstitials. N could be Y, Sc, Ti, Nb, Lu, Ta, C, Ge, N, Ga, or In, wherein the elements M and Si are completely mixed as-deposited such that the insulator layer comprises staggered edge-linked $SiO_2$-$MO_2$ bonding chains.

In another embodiment of the present invention there is provided a material comprising $M_xN_ySi_{1-x}O_2$ (~0.45≤x≤~0.55; 0≤y≤~0.05) wherein the elements M and Si are M=Zr|Hf or M=Hf and Zr—the material system may also contain small doping concentrations of elements N that do not alter the structure significantly or beyond locally but may replace M and/or Si in some sites or may exist as oxidised interstitials. N could be Y, Sc, Ti, Nb, Lu, Ta, C, Ge, N, Ga, or In, wherein the elements M and Si are mixed such that the insulator layer comprises staggered edge-linked $SiO_2$-$MO_2$ bonding chains to provide a stable 3-dimensional single crystal system.

In one embodiment the insulator layer of material comprises $M_xN_ySi_{1-x}O_2$, wherein 0.45≤x≤0.55 and 0≤y≤0.05, M comprises at least one of Hf or Zr and N comprises at least one of Y, Sc, Ti, Nb, Lu, Ta, C, Ge, N, Ga, or In and further comprising Si.

BRIEF DESCRIPTION OF THE DRAWINGS

The invention will be more clearly understood from the following description of an embodiment thereof, given by way of example only, with reference to the accompanying drawings, in which:

FIG. 3 illustrates $SiO_4$ tetrahedra (light gray), Si atoms (light grey); $MO_8$ dodecahedra (dark grey), M atoms (dark grey); and O atoms (grey);

DETAILED DESCRIPTION OF THE DRAWINGS

Figure 1:
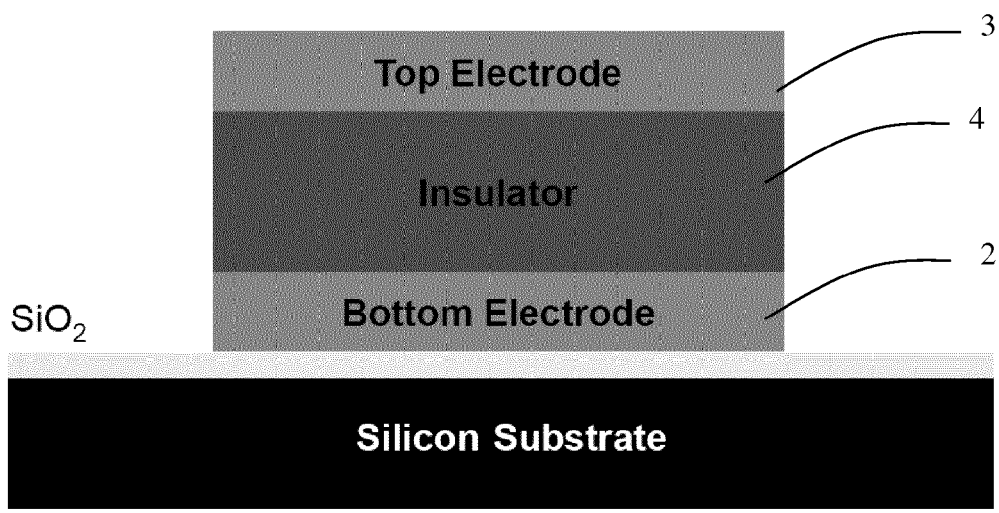
FIG. 1 illustrates a layered structure of a capacitor according to one embodiment of the invention.

Referring now to the drawings and initially FIG. 1, FIG. 1 shows a cut through section of the capacitor according to one embodiment of the present invention. The capacitor shown in FIG. 1 indicated generally by the reference numeral 1 comprises a first layer of metal type material 2 and a second layer of metal type material 3. An insulator layer of material 4 sandwiched between the first and second layers of the metal type materials. The insulator layer 4 comprises crystalline tetragonal $M_xSi_{1-x}O_2$ (~0.45≤x≤~0.55) wherein the elements M and Si (M=Zr|Hf or M=Hf and Zr). The material system may also contain small doping concentrations of elements that do not alter the structure significantly but may replace M and/or Si in some sites, or be present as interstitial oxides (e.g. Y, Sc, Ti, Nb, Lu, Ta, C, Ge, N, Ga, or In). The elements M, Si and O are completely mixed as-deposited such that the insulator layer comprises throughout only staggered edge-linked $SiO_2$-$MO_2$ bonding chains along [001], or equivalently, only staggered edge-linked $SiO_4$ tetrahedra (T) and $MO_8$ dodecahedra (D) along [001], i.e. only T-D allowed along [001]. There are also no T-T linkages (or $SiO_2$—$SiO_2$ bonding chains) allowed in any direction; and also no D-D linkages (or $MO_2$-$MO_2$ bonding chains) allowed along [001]. Subject to these three critical properties, remaining D-D linkages are then permitted along [010] and [100] to second order bonding only.

Figure 2:
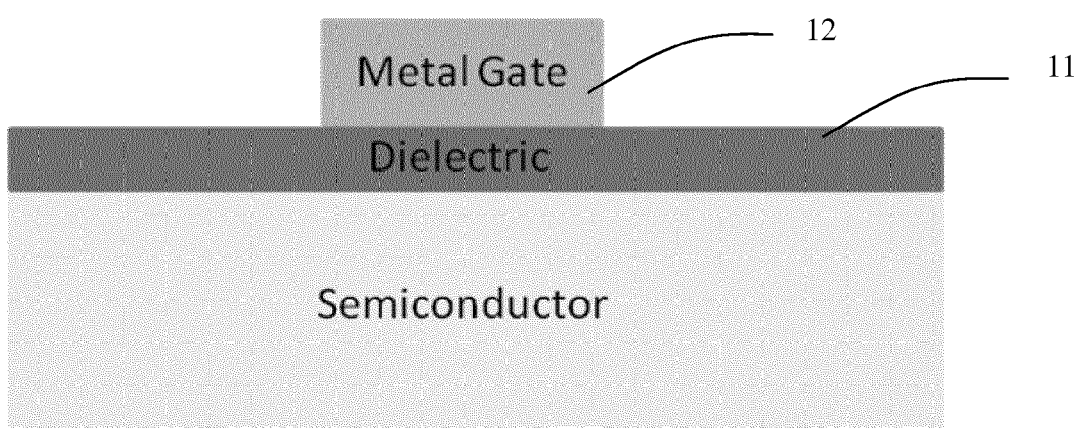
FIG. 2 illustrates a gate stack of a MOSFET device according to another embodiment of the invention.

FIG. 2 illustrates a gate stack of a MOSFET device according to another embodiment of the invention. The MOSFET device comprises a semiconductor layer 10 and a dielectric layer 11. The dielectric layer can be a single $M_xSi_{1-x}O_2$ layer, or a layer of $M_xSi_{1-x}O_2$ with a thin layer of $Al_2O_3$ between the $M_xSi_xO_2$ layer and the semiconductor, or metal gate, or both. A gate layer 12 is placed on top, the operation of which is known in the art and does not need to be describer here.

Figure 3:
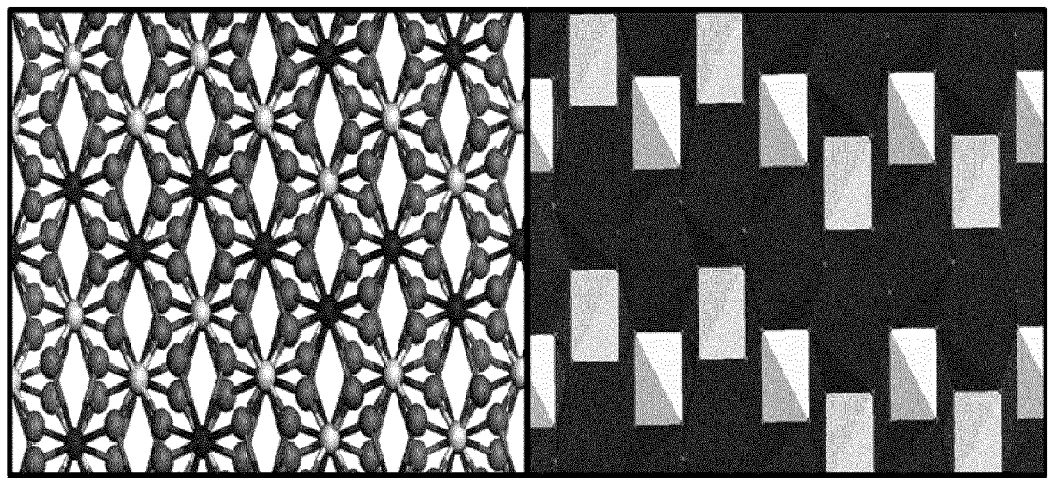
FIG. 3 illustrates ball/stick (left), and Polyhedral (right) equivalent models (viewed in the [110] plane) of the tetragonal $MSiO_4$ (M=Hf|Zr) crystalline system according to the invention.

FIG. 3 illustrates ball/stick (left), and Polyhedral (right) equivalent models (viewed in the [110] plane) of the tetragonal $MSiO_4$ (M=Hf|Zr) crystalline system according to the invention. FIG. 3 illustrates $SiO_4$ tetrahedra (light gray), Si atoms (light grey); $MO_8$ dodecahedra (dark grey), M atoms (dark grey); and O atoms (grey).

The invention involves the careful construction of single crystalline material systems to provide an effective zero alpha, effective high-k, highly stable MIM capacitor. Appropriate applications of the invention are Analog-Digital-Converters (ADCs), Digital-Analog-Converters (DACs), Micro-Electro-Mechanical-System (MEMS) radio frequency (RF) switches for terrestrial and space applications. The material is effective at low temperature, and crucially either maintains or improves in performance up to CMOS temperatures of ~1,050° C.

The invention provides for the realization of a low deposition and processing temperature ($T_p \leq 400°$ C.) material system for application in a metal-insulator-metal capacitor which yields a novel and tunable high effective k-value, zero effective alpha stable material stack exhibiting capacitance stability with voltage/frequency (a), and temperature/frequency ($\alpha_T, \alpha_f$). Alpha ($\alpha$) is the quadratic voltage coefficient of capacitance (a.k.a. QCC, VCC), and $\alpha_T/\alpha_f$ is the temperature and frequency coefficients of capacitance, respectively.

Binary high-k oxides (e.g. $MO_2$) generally give a positive polarity of alpha, and covalent low-k binary oxides (e.g. $SiO_2$) generally give a negative polarity of alpha. For $M_xSi_{1-x}O_2$ (0<x<1), the only bulk-stable and 3D-symmetric crystalline structure is x=0.5, a.k.a. $MSiO_4$ to within approximately x=0.5±0.05, but the interface of $MSiO_4$ with a Si-based or an M-based material is unstable. Nevertheless, the interface of $MSiO_4$ with $Al_2O_3$ or a metal is stable and therefore the bulk-stable 3D crystalline structural properties of $MSiO_4$ can be maintained when sandwiched between two layers of $Al_2O_3$ or two layers of metal. The effective alpha of $MSiO_4$ is a summation between a negative alpha contribution from the $SiO_2$ in $MSiO_4$ and a positive alpha contribution from the $MO_2$ in $MSiO_4$, thus providing an approximately zero alpha material. The interface of $SiO_2/MO_2$ is constantly in flux and provides its own contribution to alpha ($\sim 3 \times 10^2$) while maintaining the individual properties of $SiO_2$ and $MO_2$, ensuring the limited impact of $SiO_2/MO_2$ laminate structures. The k-value of amorphous $MSiO_4$ is ~12, but the invention can achieve slightly higher k-values of 15-17 due to the global tetragonal crystalline symmetry of the $MSiO_4$ structure, giving an approximate four times boost to the k-value for $SiO_2$ (—2.5× boost to silicon nitrides and silicon oxynitrides) while maintaining a zero alpha.

It also has very low leakage for a crystalline structure, a large band gap, and a high breakdown field. A stable 3D crystalline globally symmetric mix of $MSiO_4$, as shown in FIG. 3 reduces thermal expansion compared to $MO_2$, and reduces the spatial variation of electronic charge compared to $MO_2$.

Claims of a stable mix of amorphous or crystalline $MO_2$ (or $ZrO_2$) and amorphous/crystalline $SiO_2$ are erroneous, either in mixed format or layered format, because such a mix is inherently unstable and unless well mixed as-deposited in the unique $MSiO_4$ (zircon/hafnon) tetragonal crystalline configuration.

The single crystalline 3D crystalline structure of the present invention ensures an insulator material comprising $M_xSi_{1-x}O_2$ wherein the bonding chains between M and Si oxide elements are symmetrically linked with each other in a three dimensional way such that no two same elements of M or Si are directly linked together along [001]; no two Si oxides are directly linked in any direction; and only staggered edge-linked $MO_2$ and $SiO_2$ chains are allowed along [001].

Subject to these conditions, $MO_2$ linkages are permitted along [100] and [010]. This is critical to the stability of the structure, as well as to the low leakage, high breakdown, good k-value, and absolute alpha properties of the material. This MIM structure forms a baseline for an MIM with a k-value of 15-17. This can then be used in an extended structure as described in more detail below.

It will be appreciated that applications of the invention greatly enhance current analog device circuitry and provide a route to achieving reduced size, high speed, and lower operating voltage applications. Deposited and developed $MSiO_4$ MIMs and the initial results are outstanding, confirming the predicted properties stated.

A summary of results to date for four different prototype sets are: k-value ~15-17; $\alpha$<|50| ppm/$V^2$; Q>50; $J(@V_{op})<1\times10^{-7}$ A/cm$^2$; $E_{BV}$~6-8 MV/cm (increasing with anneal); capacitance density $(F/m^2)=(k\sim15-17)\epsilon_0/t$(in metres), where t is chosen as a balance between the required capacitance density and the minimum electric field breakdown permitted for the desired operating voltage.

Figure 4:
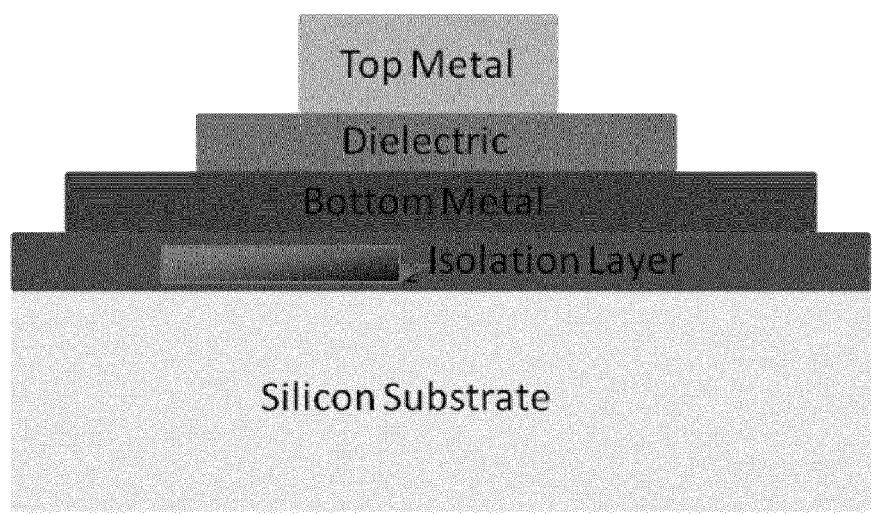
FIG. 4 illustrates a patterned MIM device that allows for direct contact to the top and bottom electrodes.

FIG. 4 illustrates a patterned MIM device that allows for direct contact to the top and bottom electrodes using the insulating material according to one embodiment of the invention.

Figure 5:
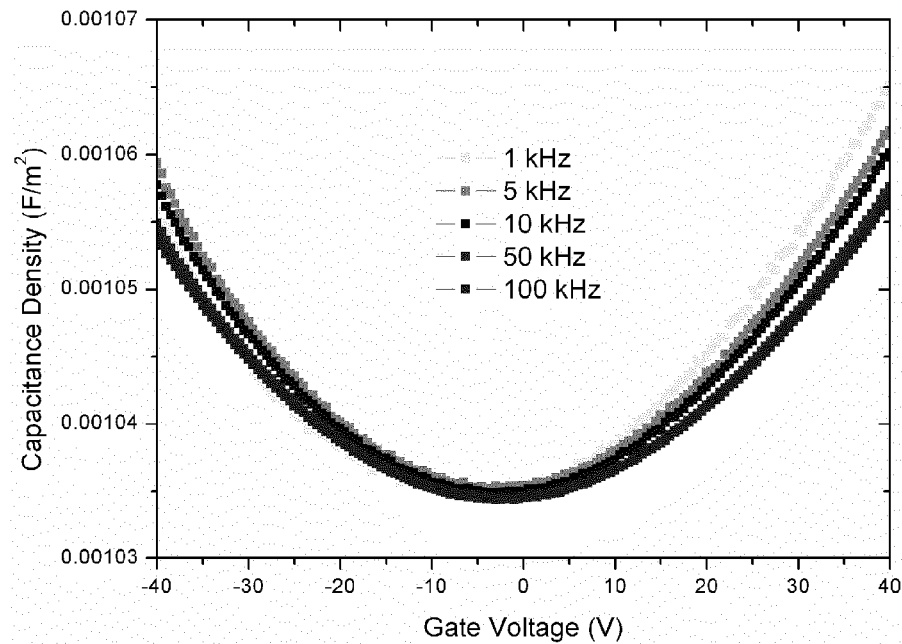
FIG. 5 illustrates capacitance density versus gate voltage at five frequencies for a prototype $Si/SiO_2/Al/130$ nm $HfSiO_4/Al$ patterned MIM capacitor.
Figure 6:
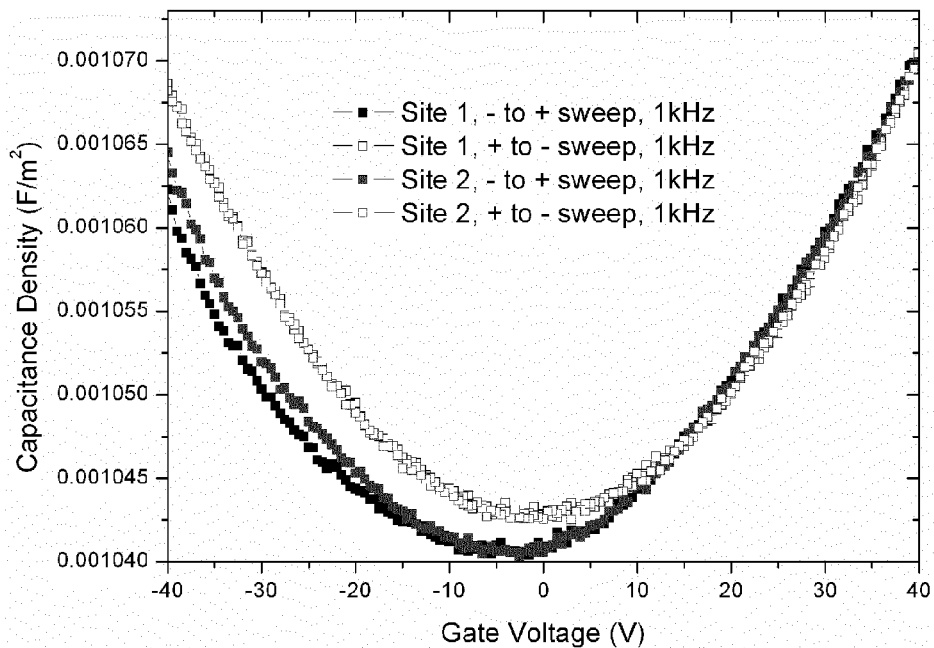
FIG. 6 illustrates capacitance density hysteresis sweeps versus gate voltage at 1 kHz for two devices of a prototype $Si/SiO_2/Al/130$ nm $HfSiO_4/Al$ patterned MIM capacitor.

FIG. 5 illustrates capacitance density versus gate voltage at five frequencies for a prototype Si/$SiO_2$/Al/130 nm $HfSiO_4$/Al patterned MIM capacitor;

FIG. 6 illustrates capacitance density hysteresis sweeps versus gate voltage at 1 kHz for two devices of a prototype Si/$SiO_2$/Al/130 nm $HfSiO_4$/Al patterned MIM capacitor.

Figure 7:
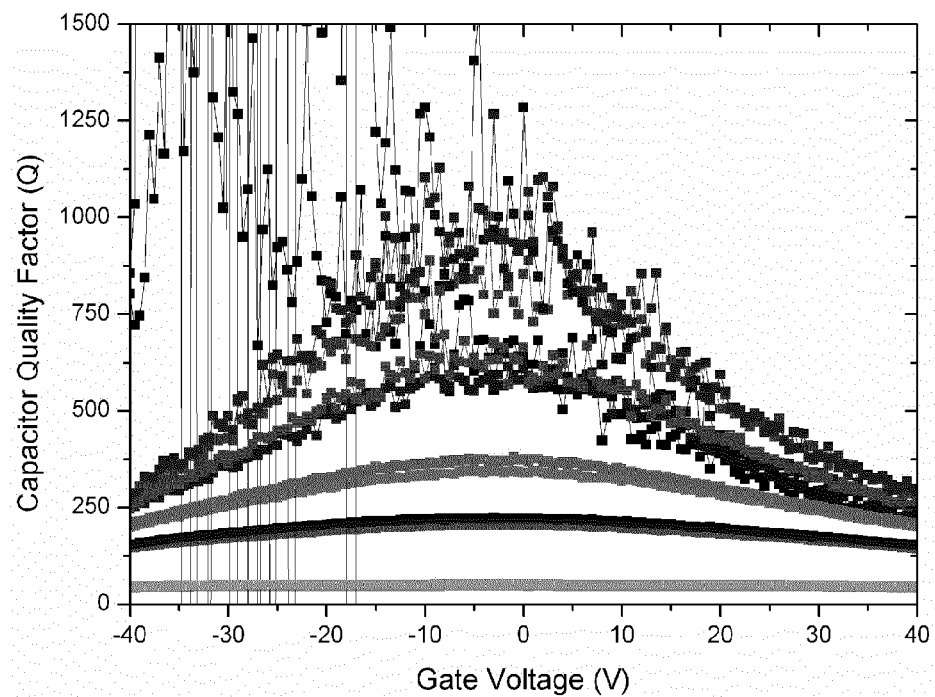
FIG. 7 illustrates capacitor quality factor (Q) versus gate voltage at five frequencies for two devices of a prototype $Si/SiO_2/Al/130$ nm $HfSiO_4/Al$ patterned MIM capacitor.

FIG. 7 illustrates capacitor quality factor (Q) versus gate voltage at five frequencies for two devices of a prototype Si/$SiO_2$/Al/130 nm $HfSiO_4$/Al patterned MIM capacitor.

Figure 8:
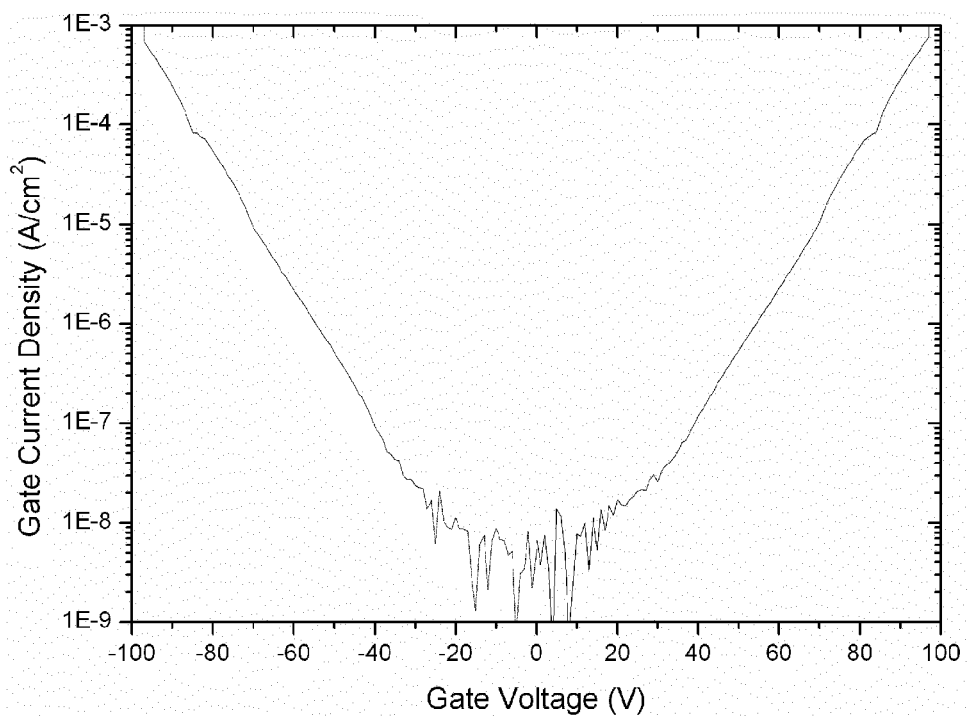
FIG. 8 illustrates Gate leakage current density versus gate voltage for two devices measured in different polarities from 0 V for a prototype $Si/SiO_2/Al/130$ nm $HfSiO_4/Al$ patterned MIM capacitor. Breakdown is seen at ~±97 V. The kinks observed between ~±70-90 V are measurement artefacts due to auto-range changing in the measurement instrument.

FIG. 8 illustrates gate leakage current density versus gate voltage for two devices measured in different polarities from 0 V for a prototype Si/$SiO_2$/Al/130 nm $HfSiO_4$/Al patterned MIM capacitor. Breakdown is seen at ~±97 V. The kinks observed between ~±70-90 V are measurement artefacts due to auto-range changing in the measurement instrument.

The desired $MSiO_4$ growth structure of tetragonal symmetry globally can be achieved using a co-pulsed (or traditional sequential metal pulse) plasma enhanced atomic layer deposition process at low temperature. The precursors that can be used are commercially available Tetrakis(ethlymethylamino) silane (TEMASi) and Tetrakis(ethylmethylamino) hafnium/zirconium (TEMAHf/TEMAZr) although other alkyl amido precursors of the general formula $(RR'N)_4Si$ and $(RR'N)_4M$, where R may or may not be equivalent to R' could be substituted. It will be appreciated that other sources of Si and HF can be used The process has four steps that are repeated in sequence; (1) pulsing of Si and M precursors; (2) purging excess of these reagents to exhaust; (3) substrate exposure to a remote $O_2$/inert gas plasma; 4) purging of residual oxidant plasma.

It will be appreciated that state of the art has solid state switches that have poor RF performance, and mechanical switches that have good RF performance but are costly, heavy, and bulky. These do not use high-k materials, and there are no MEMS RF switches available commercially using high-k materials beyond a k~6-7. Miniaturized MEMS RF capacitive switches without high-k are available and have better RF performance, light, and low cost.

However, charge trapping, stability and limited capacitance density (limited k-value) are major issues for performance. The invention addresses these bottleneck issues by providing a k of ~15-17, negligible charge trapping and high stability with the low leakage, high breakdown voltage, and high capacitance density. This will improve performance and allow for redundancy in the system.

In another embodiment of the invention there is provided a Metal-Insulator-Metal capacitor, as hereinbefore described, is adapted for use in resistive RAM and/or tuneable capacitor applications. The realisation of a low processing temperature ($T_p \leq 400°$ C.) material system for application in a metal-insulator-metal capacitor provides a novel and stable high effective k-value material system exhibiting capacitance and leakage characteristics suitable for resistive RAM and tuneable capacitor applications. This can be achieved by a plasma enhanced atomic layer deposition process to achieve low temperature growth, mix, stoichiometry, and concentration ratio of the material system for testing and potential realisation of metal-insulator-metal capacitor structures tailored for resistive RAM and tuneable capacitors.

The problem with current applications is that oxide materials that seem most suitable for RRAM (predictable leakage pathways and breakdown filaments) and tuneable capacitor (high capacitance variation with voltage, or high α, systems susceptible to significant polarisation) applications are also highly variable systems in terms of their electrical properties and atomic structure.

Using the stability of this 3D crystalline structure the M cations are replaced by Ti or Ti—O—Ti—or other elements instead of Ti that have a high polarisation in their oxide form—in low concentrations, and at well distributed locations in the material structure. This placement allows control of the interactions between these regions and maintains a stable structural matrix around these regions, which can be referred to as "X-regions". As described above the atomic structure ensures that the electrical properties exhibit low leakage, high breakdown, except now the invention provides implanted regions that allows an increase the quadratic variation of capacitance with voltage.

For resistive RAM, it is necessary to maintain these stable properties during post-breakdown operation, but engineer preferred filaments routes for leakage and breakdown pathways to form. By creating X-regions achieves preferential routes for these filaments to form without destabilising the structure of the material system and the associated variability in the resistive properties of the device. The Resistive Random Access Memory (RRAM) device comprises an insulator layer comprising crystalline tetragonal $M_xSi_{1-x}O_2$ (~0.45≤x≤~0.55) wherein the elements M and Si (M=Zr|Hf or M=Hf and Zr—the material system may also contain small doping concentrations of elements that do not alter the structure significantly but may replace M and/or Si in some sites, or exist as oxidised interstitials, e.g. Y, Sc, Ti, Nb, Lu, Ta, C, Ge, N, Ga, or In) are completely mixed as-deposited such that the insulator layer comprises throughout only staggered edge-linked $SiO_2$-$MO_2$ bonding chains along [001], or equivalently, only staggered edge-linked $SiO_4$ tetrahedra (T) and $MO_8$ dodecahedra (D) along [001], i.e. only T-D allowed along [001]. There are also no T-T linkages (or $SiO_2$—$SiO_2$ bonding chains) allowed in any direction; and also no D-D linkages (or $MO_2$-$MO_2$ bonding chains) allowed along [001]. Subject to these three critical properties, remaining D-D linkages are then permitted along [010] and [100]. Within this configuration it is possible to engineer the addition of one or more metal elements to form regions that provide for leakage and/or breakdown pathways in said 3D crystalline matrix.

In another embodiment there is provided a tunable capacitor device comprising an insulator material, said insulator layer comprises crystalline tetragonal $M_xSi_{1-x}O_2$ (~0.45≤x≤~0.55) wherein the elements M and Si (M=Zr|Hf or M=Hf and Zr—the material system may also contain small doping concentrations of elements that do not alter the structure significantly but may replace M and/or Si in some sites, or exist as oxidised interstitials, e.g. Y, Sc, Ti, Nb, Lu, Ta, C, Ge, N, Ga, or In) are completely mixed as-deposited such that the insulator layer comprises throughout only staggered edge-linked $SiO_2$-$MO_2$ bonding chains along [001], or equivalently, only staggered edge-linked $SiO_4$ tetrahedra (T) and $MO_8$ dodecahedra (D) along [001], i.e. only T-D allowed along [001]. There are also no T-T linkages (or $SiO_2$—$SiO_2$ bonding chains) allowed in any direction; and also no D-D linkages (or $MO_2$-$MO_2$ bonding chains) allowed along [001]. Subject to these three critical properties, remaining D-D linkages are then permitted along [010] and [100]. Within this configuration it is possible to engineer the addition of one or more metal elements to define at least one region of high polarisation within the stable 3D crystalline matrix. For tuneable capacitance, it is again necessary to maintain these stable properties, but operation for this application will be pre-breakdown and not post-breakdown as for RRAM. The X-regions will create regions of high polarisation but within a stable matrix. The stable matrix will allow for a degree of stable electrical behaviour while allowing the increase in capacitor variation with voltage as well as the effective k-value of the system due to the inclusion of the ultra high-k X-regions.

Figure 9:
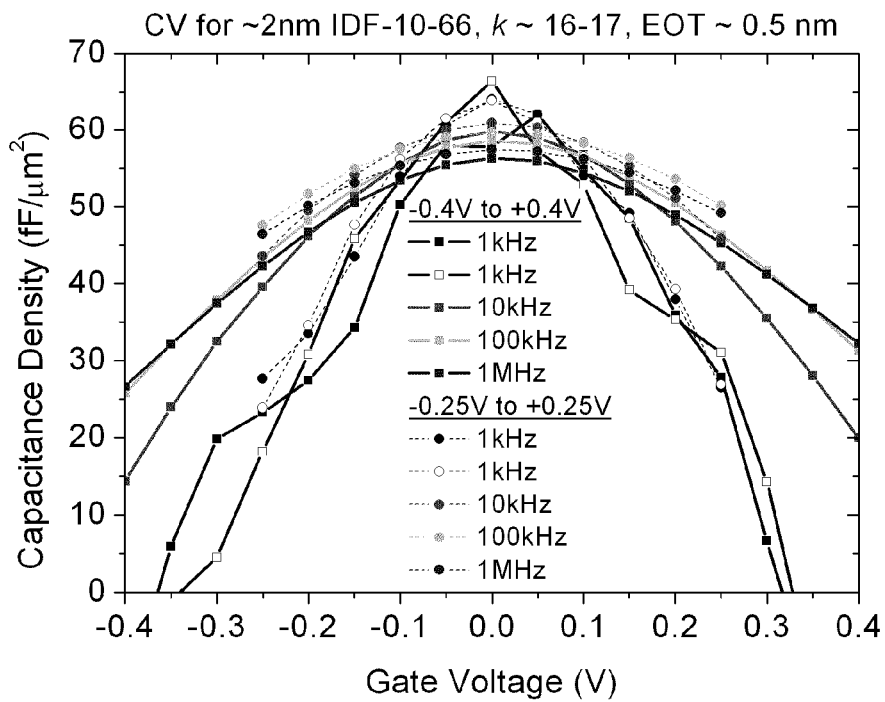
FIGS. 9 & 10 illustrates results achieved for a Dynamic Random Access Memory device, according to another embodiment of the invention.
Figure 10:
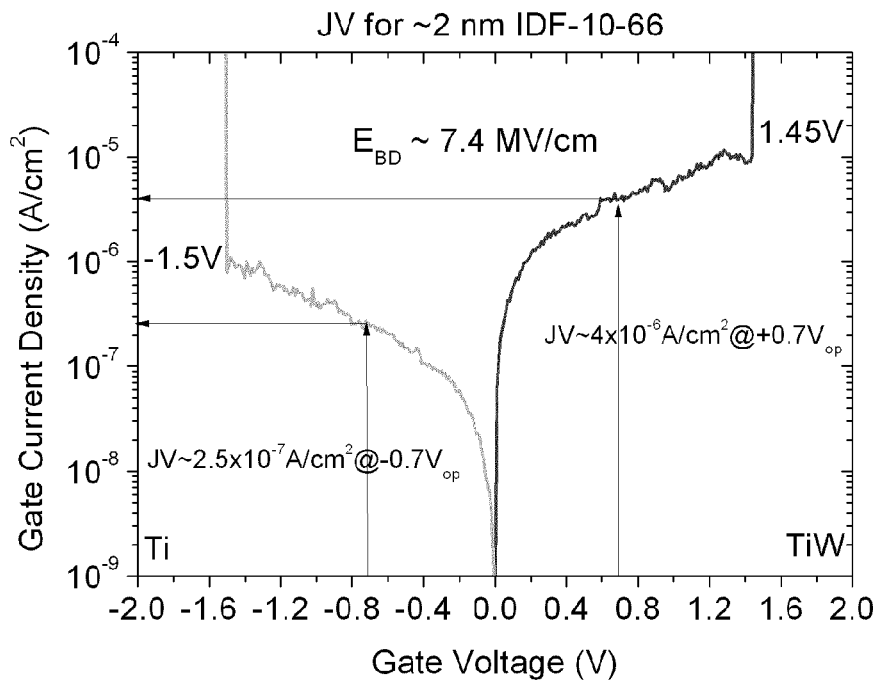

In a further embodiment the invention can be used in applications for Dynamic Random Access Memory (DRAM). FIGS. 9 and 10 illustrates results achieved using a 2 nm thick film sandwiched between Ti and TiW show breakdown fields between 7-8 MV/cm in both polarities. Leakage was found to be $\sim \pm 10^{-6}$-$\sim \pm 10^{-8}$ depending on the selected operating voltage. Capacitance density at 0V and from 1 kHz to 1 MHz was measured at ~55-67 fF/µm$^2$ for the 100 µm×100 µm and 100 µm×50 µm area capacitors (>>10 fF/µm$^2$). Linearity is not obtained at this thickness and is not a primary objective for DRAM applications. The equivalent oxide thickness is ~0.5 nm. Leakage in the positive gate voltage polarity can be improved by at least one order of magnitude by using a different electrode, such as Ti or TiN. The k-value of the thin film is estimated to be 16-17. The device can be optimised for different DRAM applications.

Figure 11A:
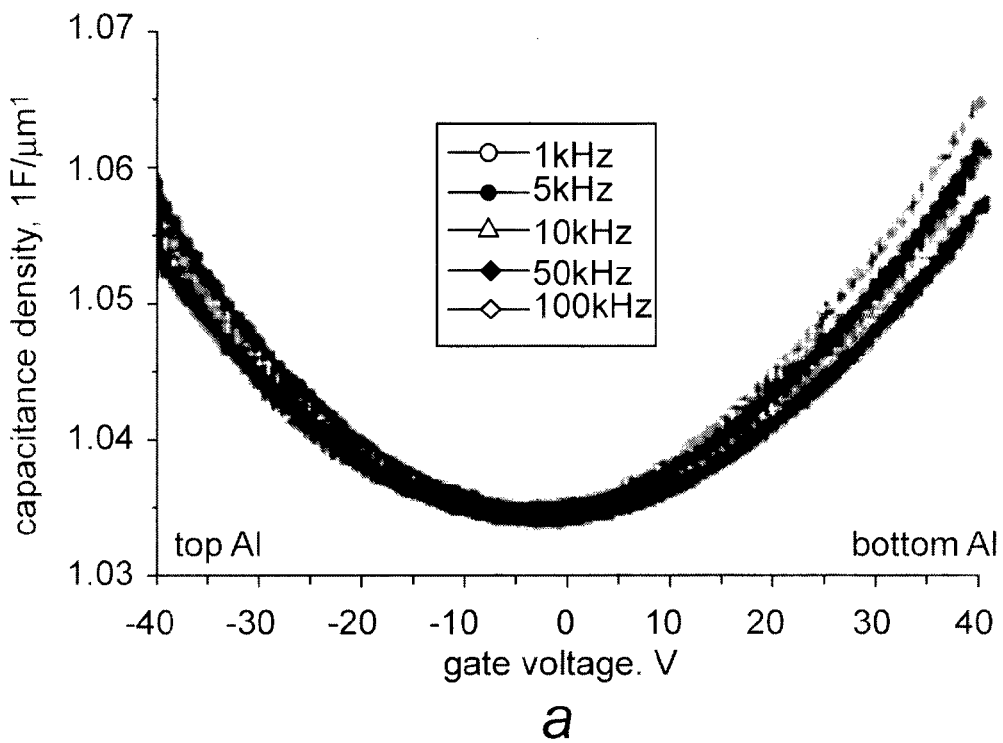
FIG. 11 illustrates at room temperature for a number of nano-scale MIM capacitors (a) multi-frequency (1 kHz-100 kHz) capacitance-voltage data over the voltage range ±40V; and (b) leakage current density versus voltage over both polarities.
Figure 11B:
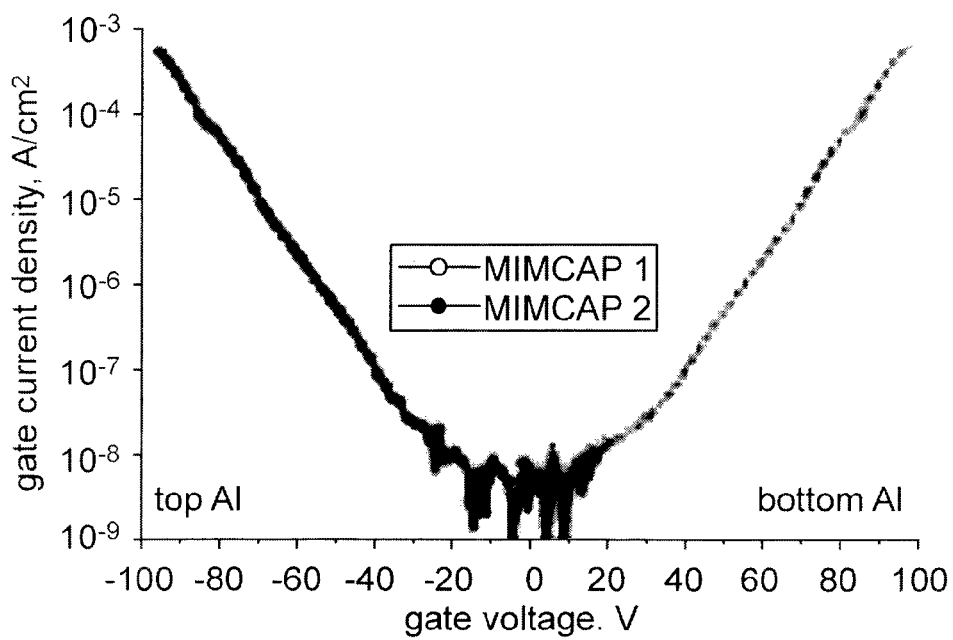

The devices analysed at room temperature in FIG. 11 had ~130 nm of metal-in-silicon-oxide (MISO) deposited on an in-house sputtered Al (~500 nm). The top electrode was deposited using a gentle process of sputtered Al (~500 nm) and patterned by lift-off (area=1×10$^{-8}$ m$^2$). $C_D$~1 fF/µm$^2$ (QCC~15 ppm/V$^2$, capacitor quality factor (Q)>50), with $E_{BD}$~7.5 MV/cm and J~2×10$^{-8}$ A/cm$^2$ at $V_{op}$=±30 V is achieved. It is generally possible to obtain such linear QCC values due to the nature of the MISO material system, although metal interface-optimisation is essential for thin film MIMCAPS with d<~50 nm. No significant bulk or interfacial charge trapping is observed (not shown). These MIM-CAPS were primarily assessed for suitability to RF MEMS applications.

Figure 12A:
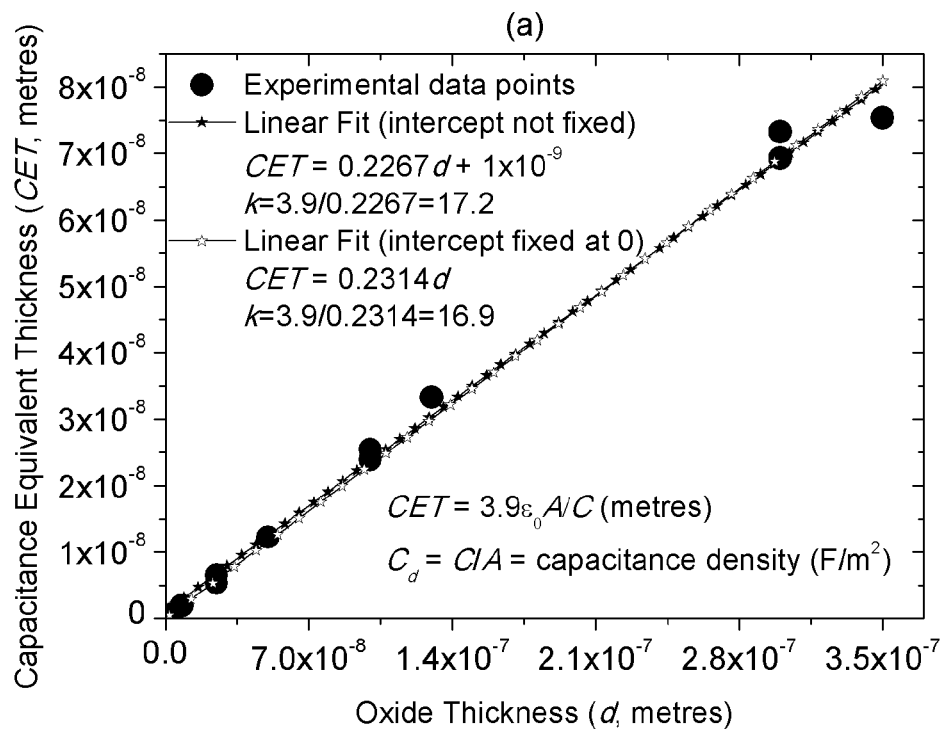
FIG. 12 illustrates at room temperature (a) capacitance equivalent thickness (CET) versus nominal film thickness, and (b) leakage current density at estimated operating voltages—with electric breakdown fields versus MISO nominal thickness.
Figure 12B:
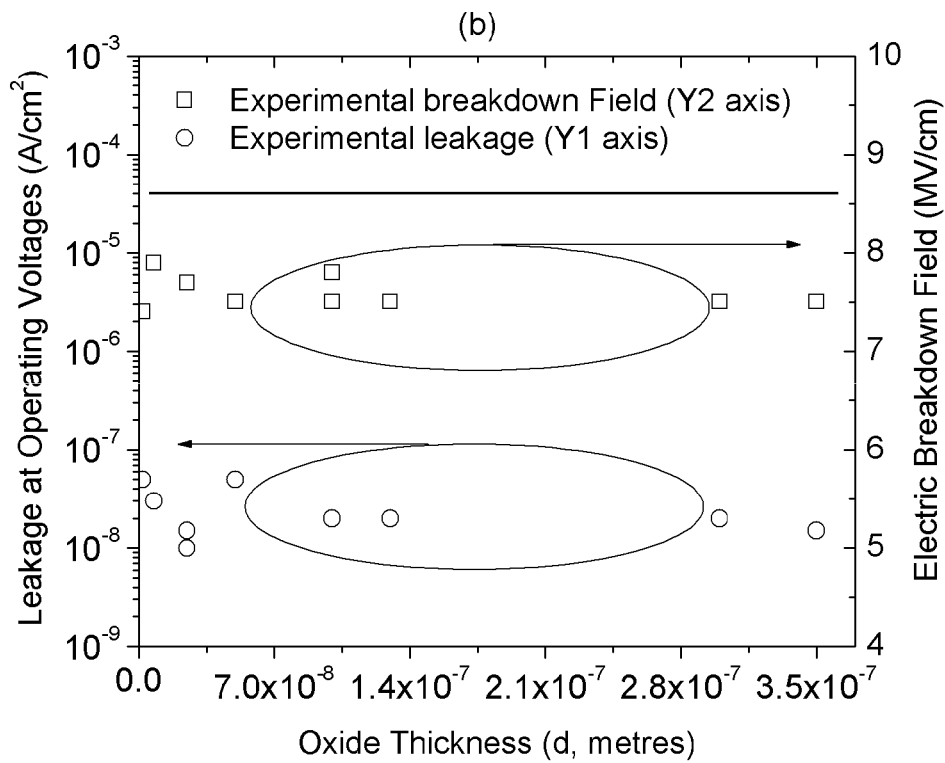

FIG. 12 shows: (a) capacitance equivalent thicknesses (CET), with linear fits to obtain an extracted MISO k-value estimate; and (b) leakage current densities at estimated operating voltages, with electric breakdown fields. These properties are plotted versus MISO nominal thickness. As-deposited and high temperature annealed samples, employing a variety of different top and bottom electrodes, are included within the analysis shown in FIG. 12, demonstrating that the optimum structure can be achieved in the as-deposited state. Linear scaling from ~350 nm to ~2 nm of the MISO MIMCAPS is a particularly unique achievement for a high-k dielectric system, and linear fits give an extracted MISO k-value estimate of ~17, which concurs well with the MIMCAPS' individual k-value extractions. Low leakage current densities at estimated operating voltages are achieved—along with high electrical breakdown fields, providing uniform results across the thickness range, showing scalability, temperature stability, and considerably improved combined properties compared to other high-k dielectric MIMCAPS when a k-value of ~17 is achieved compared to ~10 by the best alternative non-scalable laminate methods. Such combined properties, along with temperature stability, a linear QCC, and a high Q-value (not shown), are desirable for a wide range of analog-based applications. The results shown in FIG. 12 illustrate excellent repeatability; linear CET v thickness; Extracted k-value ~17; Capacitance linearity and provides a non-ideal interface.

It will be appreciated that the un-doped Hf-based invention provides stable, tailored, expected radiation-hard high-k (~17) MIMs with the following properties:

~2.5× Increase in $Si_xN_y$ or $Si_xO_yN$, capacitance density.
No significant charge trapping.
Scalable to any thickness, thick or thin film.
Low leakage current density ($<\sim1$-$5\times10^{-8}$ A/cm$^2$ for $V_{op}$).
High breakdown electric field ($\geq 7.5$ MV/cm).
Excellent bulk linearity with voltage/temperature/frequency ($|\alpha|<\sim50$-$100$ units).
CMOS temperature processing compatibility ($\leq 1050°$ C.) removing bottleneck to integration of passives with CMOS.

Figure 13:
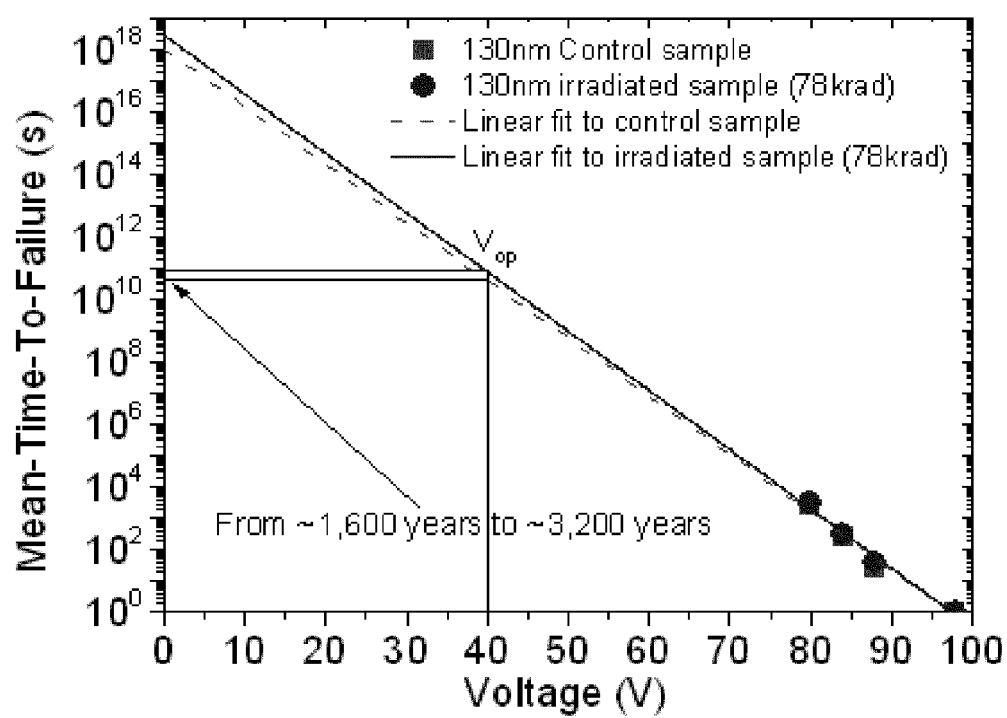
FIG. 13 illustrates results confirming the radiation hard properties of the material of the present invention.

FIG. 13 confirms the radiation hard properties of the material of the present invention, shown for an operating voltage=40V; MTTF similar for both samples; Lifetime at 40V is ~1-3 k years. As can be seen no degradation after irradiation occurs.

It will be appreciated that where M is defined above other elements N that may dope or replace a small number of sites can be provided. For example, a small number of Si sites could have Ge, or a small number of M sites could have Y, also Hf and Zr could both be present in the structure and are interchangeable. N could also be an oxidised interstitial.

In the specification the term 'metal type material' encompasses pure metal, metal alloys, and heavily doped poly Si materials, all having the conductive properties of a metal and should be afforded the widest possible interpretation in the contest of the present invention.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A capacitor device comprising a first layer of material; a second layer of material; and an insulator layer of material sandwiched between the first and second layers, wherein said insulator layer comprises a stable 3-dimensional single crystal of $M_xSi_{1-x}O_2$, wherein the elements M and Si are mixed such that the insulator layer comprises staggered edge-linked $SiO_2$-$MO_2$ bonding chains.

2. The capacitor device of claim 1, wherein the bonding chains between M and Si oxide elements are symmetrically linked with each other in a three dimensional way such that no two same elements of M or Si are directly linked together.

3. The capacitor device as claimed in claim 1, wherein the bonding chains between M and Si oxide elements are symmetrically linked with each other in a three dimensional way such that no two same elements of M or Si are directly linked together in the (001) direction and no two Si oxides are directly linked in any direction.

4. The capacitor device as claimed in claim 1, wherein the elements M and Si are completely mixed as-deposited such that the insulator layer comprises only staggered edge-linked $SiO_4$ tetrahedra (T) and $MO_8$ dodecahedra (D).

5. The capacitor device as claimed in claim 1, wherein M comprises hafnium and/or zirconium.

6. The capacitor device as claimed in claim 1, wherein the insulator layer of material comprises $M_xN_ySi_{1-x}O_2$, wherein $0.45 \leq x \leq 0.55$ and $0 < y \leq 0.05$, M comprises at least one of Hf or Zr and N comprises at least one of Y, Sc, Ti, Nb, Lu, Ta, C, Ge, N, Ga, or In.

7. The capacitor device of claim 1, wherein the insulator layer comprises a stable 3D single crystal tetragonal symmetric mix of $M_xN_ySi_{1-x}O_2$, wherein $0.45 < x < 0.55$ and $0 < y \leq 0.05$, and comprising of the elements M (Hf and/or Zr), N (Y, Sc, Ti, Nb, Lu, Ta, C, Ge, N, Ga, or In) and Si.

8. The capacitor device of claim 1, wherein the insulator layer comprises a tetragonal single crystal configuration to ensure symmetrical linkages between elements.

9. The capacitor device of claim 1, wherein the first layer of material comprises $Al_2O_3$.

10. The capacitor device of claim 1, wherein the second layer of material comprises $Al_2O_3$.

11. The capacitor device of claim 10, wherein the bulk-stable 3D single crystal structural properties of MSiO4 is adapted to be maintained when sandwiched between the first and second layers.

12. The capacitor device of claim 1, wherein the bulk-stable 3D single crystal structural properties of $MSiO_4$ is adapted to be maintained when sandwiched between the first and second layers.

13. The capacitor device of claim 1, wherein said first and second layer are made of metal-type materials.

14. A Metal-Oxide-Semiconductor (MOS) device comprising a stable 3-dimensional single crystal insulating material, wherein said insulator layer comprises $M_xSi_{1-x}O_2$ wherein the oxides of the elements M and Si are completely mixed as-deposited such that the insulator layer comprises staggered edge-linked $SiO_2$-$MO_2$ bonding chains.

15. A Resistive Random Access Memory (RRAM) device comprising a stable 3-dimensional single crystal insulator material, wherein said insulator material comprises $M_xSi_{1-x}O_2$, wherein the elements M and Si are mixed such that the insulator layer comprises staggered $SiO_2$-$MO_2$ bonding chains to form a stable 3D crystalline matrix and mixed with one or more metal elements to form regions that provide for leakage and/or breakdown pathways in the 3D crystalline matrix.

16. A Resistive Random Access Memory (RRAM) device of claim 15, wherein the one or more metal elements comprise at least one of Y, Sc, Ti, Nb, Lu, Ta, C, Ge, N, Ga, or In.

17. A Resistive Random Access Memory (RRAM) device as claimed in claim 16, wherein the insulator layer of material comprises $M_xN_ySi_{1-x}O_2$, wherein $0.45 \leq x \leq 0.55$ and $0 < y \leq 0.05$, M comprises at least one of Hf or Zr and N comprises at least one of Y, Sc, Ti, Nb, Lu, Ta, C, Ge, N, Ga, or In.

18. A Resistive Random Access Memory (RRAM) device as claimed in claim 15, wherein the insulator layer of material comprises $M_xN_ySi_{1-x}O_2$, wherein $0.45 \leq x \leq 0.55$ and $0 < y \leq 0.05$, M comprises at least one of Hf or Zr and N comprises at least one of Y, Sc, Ti, Nb, Lu, Ta, C, Ge, N, Ga, or In.

19. A tunable capacitor device comprising a stable 3-dimensional single crystal insulator material, said insulator material comprises $M_xSi_{1-x}O_2$ wherein the elements M and Si are mixed such that the insulator layer comprises staggered $SiO_2$-$MO_2$ bonding chains to form a stable 3D crystalline matrix and mixed with one or more metal elements to define at least one region of high polarisation within the stable 3D crystalline matrix.

20. A tunable capacitor device of claim 19, wherein the one or more metal elements comprise at least one of Y, Sc, Ti, Nb, Lu, Ta, C, Ge, N, Ga, or In.

21. A tunable capacitor device as claimed in claim 19, wherein the insulator layer of material comprises $M_xN_ySi_{1-x}O_2$, wherein $0.45 \leq x \leq 0.55$ and $0 < y \leq 0.05$, M comprises at least one of Hf or Zr and N comprises at least one of Y, Sc, Ti, Nb, Lu, Ta, C, Ge, N, Ga, or In.

\* \* \* \* \*